United States Patent
Garcia De Gorordo et al.

(10) Patent No.: US 11,764,041 B2
(45) Date of Patent: Sep. 19, 2023

(54) ADJUSTABLE THERMAL BREAK IN A SUBSTRATE SUPPORT

(71) Applicant: Applied Materials, Inc., Santa Clara, CA (US)

(72) Inventors: Alvaro Garcia De Gorordo, San Francisco, CA (US); Daniel Sang Byun, Campbell, CA (US); Andreas Schmid, Meyriez (CH); Stephen Donald Prouty, San Jose, CA (US); Andrew Antoine Noujaim, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 480 days.

(21) Appl. No.: 16/901,797

(22) Filed: Jun. 15, 2020

(65) Prior Publication Data

US 2020/0395197 A1    Dec. 17, 2020

Related U.S. Application Data

(60) Provisional application No. 62/861,935, filed on Jun. 14, 2019.

(51) Int. Cl.
| H01J 37/32 | (2006.01) |
|---|---|
| H01L 21/683 | (2006.01) |
| C23C 16/46 | (2006.01) |
| C23C 16/458 | (2006.01) |

(52) U.S. Cl.
CPC .... *H01J 37/32724* (2013.01); *C23C 16/4581* (2013.01); *C23C 16/466* (2013.01); *H01J 37/321* (2013.01); *H01L 21/6833* (2013.01); *H01J 2237/002* (2013.01); *H01J 2237/3341* (2013.01)

(58) Field of Classification Search
CPC .............. H01J 37/32724; H01J 37/321; H01L 21/6833
See application file for complete search history.

(56) References Cited

U.S. PATENT DOCUMENTS

| 6,558,508 | B1 | 5/2003 | Kawakami |
|---|---|---|---|
| 6,949,722 | B2 | 9/2005 | Strang et al. |
| 7,161,121 | B1 | 1/2007 | Steger |
| 7,230,204 | B2 | 6/2007 | Mitrovic et al. |
| 7,651,583 | B2 | 1/2010 | Kent et al. |
| 8,007,591 | B2 | 8/2011 | Hamelin |
| 9,779,955 | B2 | 10/2017 | Lill et al. |
| 10,283,398 | B2 | 5/2019 | Tanaka et al. |
| 2002/0014894 | A1 | 2/2002 | Yonezawa et al. |
| 2002/0144786 | A1* | 10/2002 | Chiang ............. H01J 37/32862 156/345.52 |
| 2008/0217293 | A1 | 9/2008 | Iimuro |

(Continued)

*Primary Examiner* — Scott Bauer
(74) *Attorney, Agent, or Firm* — Patterson + Sheridan, LLP

(57) ABSTRACT

Embodiments described herein relate to a substrate support assembly which enables adjustment of the thermal conductivity therein. The substrate support assembly has heater and cooling channel. An adjustable thermal break disposed between the heater and the cooling channel. The adjustable thermal break has one or more fluid conduits coupled thereto and configured to flow a fluid into and out of the adjustable thermal break for variant the thermal conductivity between the heater and the cooling channel.

18 Claims, 4 Drawing Sheets

(56) References Cited

U.S. PATENT DOCUMENTS

| | | |
|---|---|---|
| 2010/0122774 A1 | 5/2010 | Makabe et al. |
| 2015/0060013 A1* | 3/2015 | Buchberger, Jr. ............................ H01L 21/67109 |
| | | 156/345.29 |
| 2018/0076048 A1 | 3/2018 | Gohira et al. |
| 2018/0197761 A1 | 7/2018 | Ferrara et al. |
| 2018/0211822 A1 | 7/2018 | Gohira et al. |
| 2018/0211824 A1 | 7/2018 | Kudo et al. |
| 2018/0247826 A1 | 8/2018 | Nakaya et al. |
| 2018/0350561 A1 | 12/2018 | Yamaguchi et al. |
| 2018/0350568 A1 | 12/2018 | Mitsumori et al. |
| 2019/0027345 A1 | 1/2019 | Ishikawa et al. |
| 2019/0035609 A1 | 1/2019 | Tobe |

\* cited by examiner

ADJUSTABLE THERMAL BREAK IN A SUBSTRATE SUPPORT

CROSS-REFERENCE TO RELATED APPLICATIONS

This application claims benefit of U.S. Provisional Application Ser. No. 62/861,935, filed Jun. 14, 2019, of which is incorporated by reference in its entirety.

BACKGROUND

Field

Embodiments of the present disclosure generally relate to semiconductor manufacturing and more particularly to a substrate support assembly enabling a cryogenic temperature operation.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at cryogenic temperatures, i.e., the production and behavior of materials at very low temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed.

Conversely, some fabrication techniques being explored for next generation devices under current development require processing at extremely high temperatures. The thermal control in a substrate support assembly in either the cryogenic or high temperature operations often rely on heaters in the substrate support which end up dumping heat into the cooling base while trying to maintain the temperature of the substrate support across operations on multiple substrates. When the plasma heat load is not present, the resistive heaters must deliver heat at the same power level. Meanwhile, the thermal mass of the cooling base is pulling heat away from the substrate support. That is, when the power is being supplied to the heaters for heating, chillers are working to take away that heat. Meanwhile wafer through-put is limited by time for temperature change, temperature overshoot and settling time.

Thus, there is a need for a substrate support having improved temperature control.

SUMMARY

Embodiments described herein relate to a substrate support assembly which enables adjustment of the thermal conductivity therein. The substrate support assembly has a heater and a cooling channel. An adjustable thermal break disposed between the heater and the cooling channel. The adjustable thermal break has one or more fluid conduits coupled thereto and configured to flow a fluid into and out of the adjustable thermal break for varying the thermal conductivity between the heater and the cooling channel.

In another embodiment, a process chamber has a substrate support assembly which enables adjustment of the thermal conductivity therein. The processing chamber has a chamber body having walls and a lid defining a processing region. The substrate support assembly is disposed in the processing region. The substrate support assembly has heater and cooling channel. An adjustable thermal break disposed between the heater and the cooling channel. The adjustable thermal break has one or more fluid conduits coupled thereto and configured to flow a fluid into and out of the adjustable thermal break for varying the thermal conductivity between the heater and the cooling channel.

In yet another embodiment, a method for adjusting the thermal conductivity between a heater and a cooling base in a substrate support assembly is disclosed. The method includes delivering cooling fluid to a cooling base of a substrate support assembly. The substrate support assembly has heaters disposed therein above the cooling base. A gas is introduced at a first pressure to an adjustable thermal break disposed between the heater and the cooling base. The gas is introduced at a second pressure different than the first pressure to modify the thermal conductivity between the heaters and the cooling base.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables both cryogenic and high temperature operation of a substrate support such that a substrate disposed thereon is maintained at a processing temperature suitable for processing while other surfaces of a processing chamber are maintained at a different second temperature. Additionally, as the substrate is moved out of the processing chamber and the plasma is off, the substrate support assembly efficiently maintains the temperature of the substrate support in anticipation of a next substrate for processing.

The embodiments described herein provide a substrate support assembly having a gap between a heater, i.e., heat source, and a cooling channel in the cooling base, i.e., heat sink when a cooling fluid is flowing in the cooling channels. The gap is empty or is filled with a thermally conductive medium, such as a liquid or a gas. Heat transfer through the gap can be managed by controlling thermal conduction across the gap by adjusting a type of fluid, temperature of the fluid, fluid pressure or providing a vacuum in the gap. Thus, the gap operates as a switch to manage heat transfer by both conduction and/or convection across the gap, and consequently, through the substrate support assembly. Advantageously, the thermal response of the substrate support assembly provides better and faster control of the temperature of the substrate disposed on the substrate support assembly during processing. Optionally, using a backside gas to fill the gap additionally allows the existing substrate support assembly to be modified easily to utilize the techniques disclosed herein.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing necessitates the temperature of a substrate to be tightly maintained.

Figure 1:
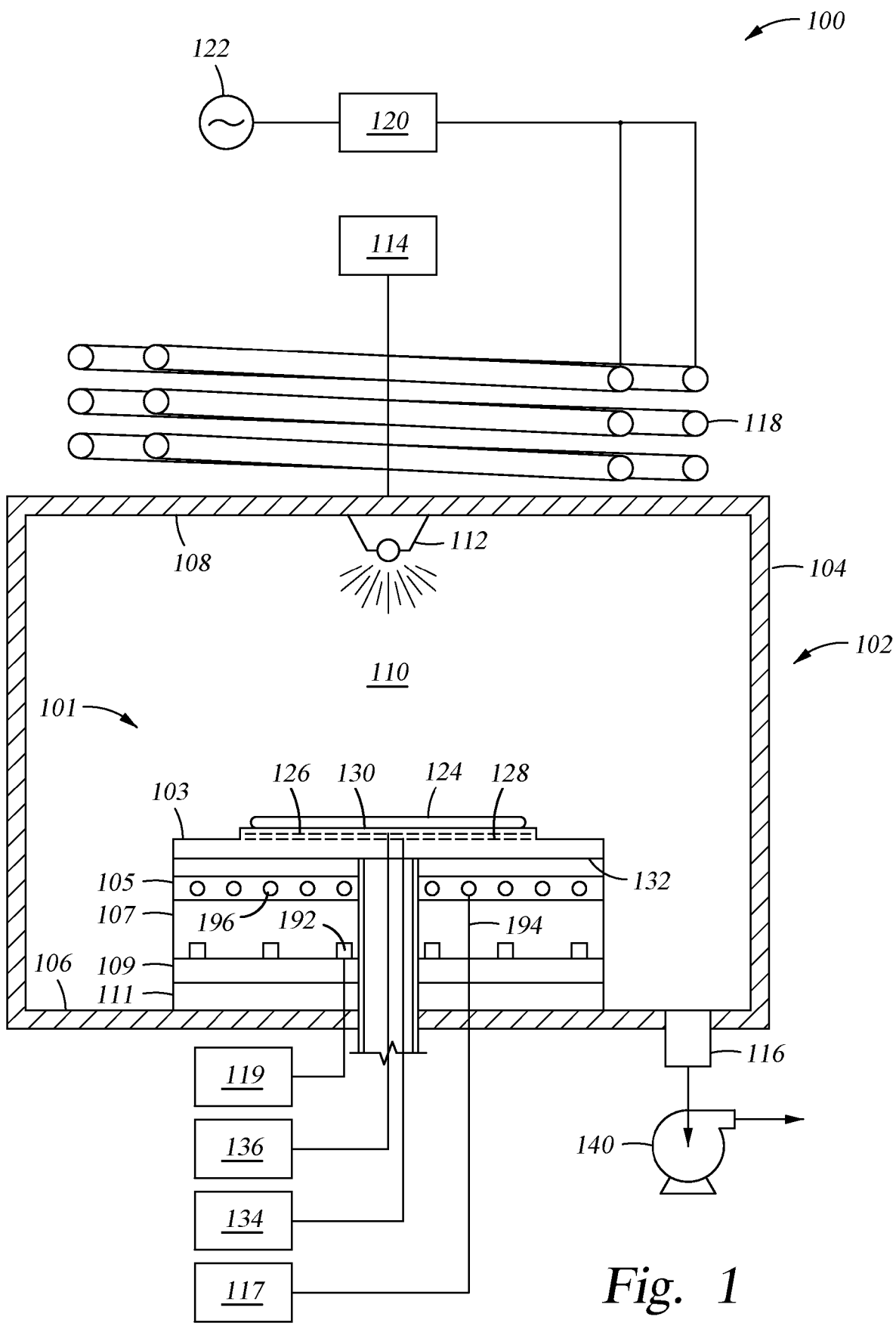
FIG. 1 is a cross-sectional schematic view of an exemplary plasma processing chamber.

FIG. 1 is a cross-sectional schematic view of an exemplary plasma processing chamber 100, shown configured as an etch chamber, having a substrate support assembly 101. The substrate support assembly 101 may be utilized in other types of plasma processing chambers as discussed above. Maintaining temperature control of the substrate 124 on the substrate support assembly 101 provides improved processing results for the variety of processing chambers 100. Here, dry reactive ion etching a substrate 124 maintained at a cryogenic temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic temperature is decreased, while ions continue to bombard the upward facing surface of the low-k dielectric material to form trenches with smooth, vertical sidewalls. Additionally, selectivity of etching one material versus another can be improved at cryogenic temperatures. For example, selectivity between silicon (Si) and silicon dioxide ($SiO_2$) increases exponentially as temperature is decreased when etched with certain chemistries.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzles or inlet ports, or alternatively a showerhead.

The process gases may be energized to form a plasma within the processing region 110. The process gases may be energized by capacitively or inductively coupling RF power to the process gases. In the embodiment depicted in FIG. 1, a plurality of coils 118 are disposed above the lid 108 of the plasma processing chamber 100 and coupled through a matching circuit 120 to an RF power source 122. The coils 118 inductively coupling RF power to the process gases in the processing region 110 to maintain the plasma in the processing chamber 100.

Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110.

The substrate support assembly 101 is disposed in the processing region 110 below the injection apparatus 112. The substrate support assembly 101 includes a substrate support 103 and a cooling base assembly 105. It should be appreciated that the substrate support 103 may be a heater, vacuum chuck, pedestal, electrostatic chuck (ESC) or other type of structure supporting a substrate 124 during processing. Herein, for ease of discussion, the substrate support 103 going forward will be discussed as an electrostatic chuck (ESC) 103. The cooling base assembly 105 is coupled to the ESC 103 and a facility plate 107. The facility plate 107 may be supported by a ground plate 111. The facility plate 107 is configured to facilitate the electrical, cooling, heating, and gas connections with the substrate support assembly 101. The ground plate 111 is supported by the bottom 106 of the processing chamber. An insulator plate 109 insulates the facility plate 107 from the ground plate 111.

The cooling base assembly 105 includes a coolant channel 196 coupled to a chiller 117, such as a cryogenic chiller or other suitable chiller. The chiller 117 is in fluid communication with the coolant channel 196 via a coolant conduit 194 such that the cooling base assembly 105 is maintained at a predetermined cryogenic temperature. In one embodiment, the chiller 117 is coupled to an interface box to control a flow rate of the coolant. The coolant may include a material that can maintain a cryogenic temperature, i.e., less than about −80 degrees Celsius. Alternately, the coolant may be suitable to maintain a temperature above 0 degrees Celsius. The chiller 117 provides the coolant which is circulated through the coolant channel 196 of the cooling base assembly 105. The coolant flowing through the coolant channel 196 enables the cooling base assembly 105 to be maintained at the cryogenic temperature, which assists in controlling the lateral temperature profile of the ESC 103 so that a substrate 124 disposed on the ESC 103 is uniformly maintained at a processing temperature.

The facility plate 107 includes a coolant channel 192 coupled to a chiller 119. The chiller 119 is in fluid communication with the coolant channel 192 via a coolant conduit connected to the coolant channel 192 such that the facility plate 107 is maintained a predetermined ambient temperature. In one embodiment, the chiller 119 is coupled to an interface box to control a flow rate of the coolant. The coolant may include a material that can maintain an ambient temperature between about −20 degrees Celsius to about +60 degrees Celsius. The chiller 119 provides the coolant, which is circulated through the coolant channel 192 of the facility plate 107. The coolant flowing through the coolant channel 192 enables the facility plate 107 to be maintained at the predetermined temperature, which assists in maintaining the insulator plate 109 at the predetermined temperature and prevents byproduct condensation on the ESC 103.

The ESC 103 has a support surface 130 and a bottom surface 132 opposite the support surface 130. In one embodiment, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a mono polar or bipolar electrode, or other suitable arrangement. The chucking electrode 126 is coupled through an RF filter to a chucking power source 134. The chucking power source 134 provides a DC power to the chucking electrode 126 so as to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to elevate the temperature of the ESC 103 to the cryogenic processing temperature suitable for processing a substrate 124 disposed on the support surface 130. The resistive heaters 128 are coupled through the facility plate 107 to a heater power source 136. The heater power source 136 may provide about 100 Watts or more power to the resistive heaters 128. The heater power source 136 includes a controller (not shown) utilized to control the operation of the heater power source 136, which is generally set to heat the substrate 124 to a predetermined temperature. In one embodiment, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones, such as four zones having independent resistive heaters 1281, 1282, 1283, 1284 . . . 128n. The resistive heaters 128 maintain the substrate 124 at a temperature suitable for processing. In one embodiment, the processing temperature is less than about −50 degrees Celsius. For example, the processing temperature is between about −50 degrees Celsius to about −150 degrees Celsius.

Figure 2:
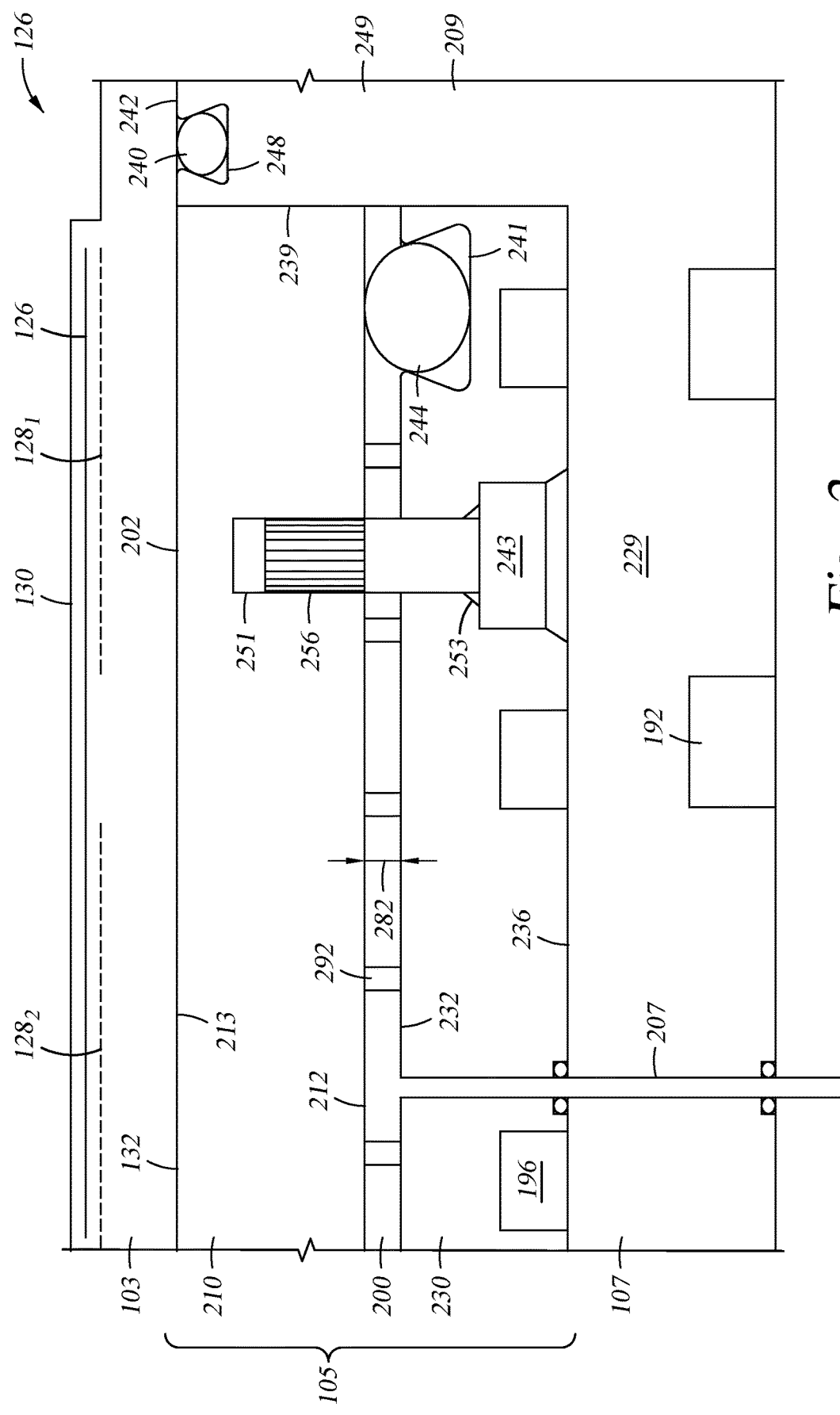
FIG. 2 is a cross-sectional schematic view of an exemplary substrate support assembly of the processing chamber of FIG. 1.

FIG. 2 is a cross-sectional schematic view of an exemplary substrate support assembly 101 of the processing chamber 100 of FIG. 1. The substrate support assembly 101 has an adjustable thermal break 200 disposed in the substrate support assembly 101. The ESC 103 is coupled to the cooling base assembly 105. In one embodiment, the ESC 103 is secured to the cooling base assembly 105 with a bonding layer 202. The bonding layer 202 may include epoxy containing materials, a perfluoropolymer or other suitable material.

The facility plate 107 is disposed below and attached to the cooling base assembly 105 and attached thereto. The facility plate 107 may be formed from aluminum, molybdenum, or other suitable materials. In one embodiment, the facility plate 107 is formed from aluminum. The facility plate 107 facilitates the electrical and fluid connections for the cooling base assembly 105 and ESC 103.

The facility plate 107 includes a plate portion 229 and flange portion 249. The plate portion 229 of the facility plate 107 has a plurality of holes disposed therethrough. The holes in the plate portion 229 are configured to accept a mechanical fastener. The mechanical fastener may draw the cooling base assembly 105 tight to the facility plate 107 for securing the substrate support assembly 101 together. A groove 248 is formed in a top surface 242 of the flange portion 249. The groove 248 is configured to accept a gasket 240, such as an O-ring. The gasket 240 provides a seal between the ESC 103 and the facility plate 107.

An insulator plate may be disposed below the facility plate 107 in the formation of the substrate support assembly 101. A ground plate may be disposed below the insulator plate. It should be appreciated that there may be other assemblies as part of the substrate support assembly 101 and these additional assemblies may contribute to the thermal control of the ESC 103.

The cooling base assembly 105 may be formed from an aluminum alloy, molybdenum, or other suitable material. In one embodiment, the cooling base assembly 105 is formed from aluminum. In one example, the cooling base assembly 105 may have a thermal conductivity between about 151 W/(m·K) and about 202 W/(m·K) and linear thermal expansion coefficient of about $2.32 \times 10^{-5}$ 1/K. However, it should be appreciated that the cooling base assembly 105 may have a thermal conductivity and thermal expansion suited to the operating temperature range for the substrate support assembly 101.

The cooling base assembly 105 has an outer diameter 239. The cooling base assembly 105 has a metal base 210 and a cooling base 230. The metal base 210 has a top surface 213, and a bottom surface 212. The top surface 213 of the metal base 210 is disposed on the bottom surface 132 of the ESC 103. The metal base 210 may have a plurality of holes 251. The holes 251 may be threaded or otherwise configured to accept a fastener 243. The outer diameter 239 of the cooling base assembly 105, i.e., the metal base 210, may be smaller than the outer diameter 209 of the substrate support assembly 101. The difference in the radius of the outer diameter 209, 239, may be between about 2 mm and about 20 mm.

The metal base 210 may be formed from of a metal such as aluminum, AlSiC, molybdenum or other suitable metal. In one embodiment, the metal base 210 is formed from molybdenum. The metal base 210 may be adhered to the ESC 103 by diffusion or through other appropriate bonding techniques such as by the use of the bonding layer 202.

The cooling base 230 may be formed from an aluminum alloy, molybdenum, or other suitable material. In one embodiment, the cooling base 230 is formed from aluminum. The cooling base 230 has a plurality of coolant channels 196. The coolant channels 196 are configured to flow a cooling fluid.

The cooling base 230 has a diameter substantially similar to the metal base 210. The cooling base 230 has a top surface 232 and a bottom surface 236. The top surface 232 may optionally have a groove 241. The groove 241 is configured to accept a gasket 244 therein. The gasket 244 forms a seal between the cooling base 230 and the metal base 210. The seal between the cooling base 230 and the metal base 210.

In one example, the adjustable thermal break 200 is disposed in the cooling base assembly 105. In another example, the adjustable thermal break 200 is disposed between the cooling base 230 and the metal base 210. The adjustable thermal break 200 has a height 282 extending from the bottom surface 212 of the metal base 210 and the top surface 232 of the cooling base 230. The height 282 may be between about 2 µm (microns) and about 20 µm, such as about 10 µm. The adjustable thermal break 200 is configured to flow a fluid, such as a gas or liquid, or a vacuum which alters the thermal properties of the adjustable thermal break 200, for example, the rates of heat transfer between the top and bottom of the substrate support assembly 101.

The adjustable thermal break 200 may have a plurality of stand-offs 292 to separate the cooling base 230 from the metal base 210. The stand-offs 292 may be formed from a thermally insulating material having a low thermal conductivity. The stand-offs 292 may be formed from quartz, phyllosilicate, silica, a nickel-chromium-based alloy or other suitable material. The stand-offs 292 may be sized equal to or greater than the height 282 such that the stand-offs 292 are in contact with the bottom surface 212 of the metal base 210 and the top surface 232 of the cooling base 230. The stand-offs 292 may be individually tubes or cylinders. Alternately, the stand-offs 292 may be have a rectangular or other geometric profile. The size and location for each individual stand-off 292 allows for customization and control of the heat transfer rate between the metal base 210 and the cooling base 230. The stand-offs 292 may optionally be connected to one another through either one or both of a top sheet (not shown) along the bottom surface 212 of the metal base 210 or a bottom sheet (not shown) along the top surface 232 of the cooling base 230. The connected stand-offs 292 allow for easy of manufacture.

The adjustable thermal break 200 has one or more fluid conduits 207 attached thereto. The adjustable thermal break 200 may be filled with a fluid such as helium (He) or other gas supplied. In one example, the fluid conduits 207 is connected to the source of the backside gas routed to or through the ESC 103. The fluid conduits 207 transport fluids, such as the gas, to and from the adjustable thermal break 200. In one embodiment, the adjustable thermal break 200 has one fluid conduit 207 through which fluid is delivered and removed from the adjustable thermal break 200. The one fluid conduit 207 may both transport and evacuate fluid from the adjustable thermal break 200. A valve (not shown), or pressure controller, may switch the fluid conduit 207 between a fluid source and a vacuum or other drain system and pressurize the fluid in the adjustable thermal break 200. A pressure controller may be used to maintain the pressure of the variable thermal break at a desired thermal conductivity. In another embodiment, the variable thermal break has two fluid conduits 207. One fluid conduit 207 may act as a fill tube for transporting fluids to the adjustable thermal break 200. The second fluid conduit 207 may act as an evacuation tube for removing fluids from the adjustable thermal break 200. It should be appreciated that the fluid within the adjustable thermal break is not for circulation but for controlling the thermal conductivity of the adjustable thermal break 200. In yet other embodiments, there may be more than one fluid conduit 207 for transporting fluids to the adjustable thermal break 200 and more than one fluid conduit 207 for evacuating the fluids from the adjustable thermal break 200. In this manner, a trade-off between simplicity and ease of incorporating the fluid conduits in the substrate support assembly and a quicker response for multiple fluid conduits 207 can be made. It should be appreciated, that when the fluid conduit 207 is filling the adjustable thermal break 200 with a fluid that the fluid conduit 207 acting as a drain for that fluid would be in a partially closed or closed position. Thus, fluid may be pressurized in the adjustable thermal break 200 by filling with the fluid conduit 207 and ensuring no fluid is being lost on a drain side for the fluid conduit 207.

The presence (or lack) of fluid in the adjustable thermal break 200 controls the thermal conductivity across the adjustable thermal break 200. The adjustable thermal break 200 can be made more thermally conductive or even insulated based on the presence of fluid and the pressure of the fluid flow rate and type of fluid within the adjustable thermal break 200. For example, introduction of helium (He) gas into the adjustable thermal break 200 through the fluid conduit will increase the thermal conduction across the adjustable thermal break 200 from the ESC 103 to the cooling base 230. Increasing the pressure of the He gas increases the density of the He gas and increases the rate of conduction. Accordingly, the thermal conductivity can be controlled and varied by controlling the fluid within the adjustable thermal break 200, thus controlling the rate of heat transfer between the ESC 103 and the cooling base 230.

A thermal gradient can be found extending from the cooling base 230 through the substrate support assembly 101. In one example, the ESC 103 during processing a substrate is at a higher temperature than the cooling base 230. Here in the example, the direction and the temperature changes, i.e., the thermal gradient, within the substrate support assembly 101, the temperature declines from the heat source at the ESC 103 to the heat sink at the cooling base 230, i.e., a positive thermal gradient. For example, during a cryogenic operation of the substrate support assembly 101, the ground plate may be maintained at a temperature of about 50° Celsius while the cooling base 230 operates at a temperature of about −150° Celsius, while the substrate 124 is maintained at a temperature of about −70° Celsius. The thermal gradient and operation of the adjustable thermal break 200 to control the temperature of the substrate 124 will be discussed further with respect to FIG. 3.

Figure 3:
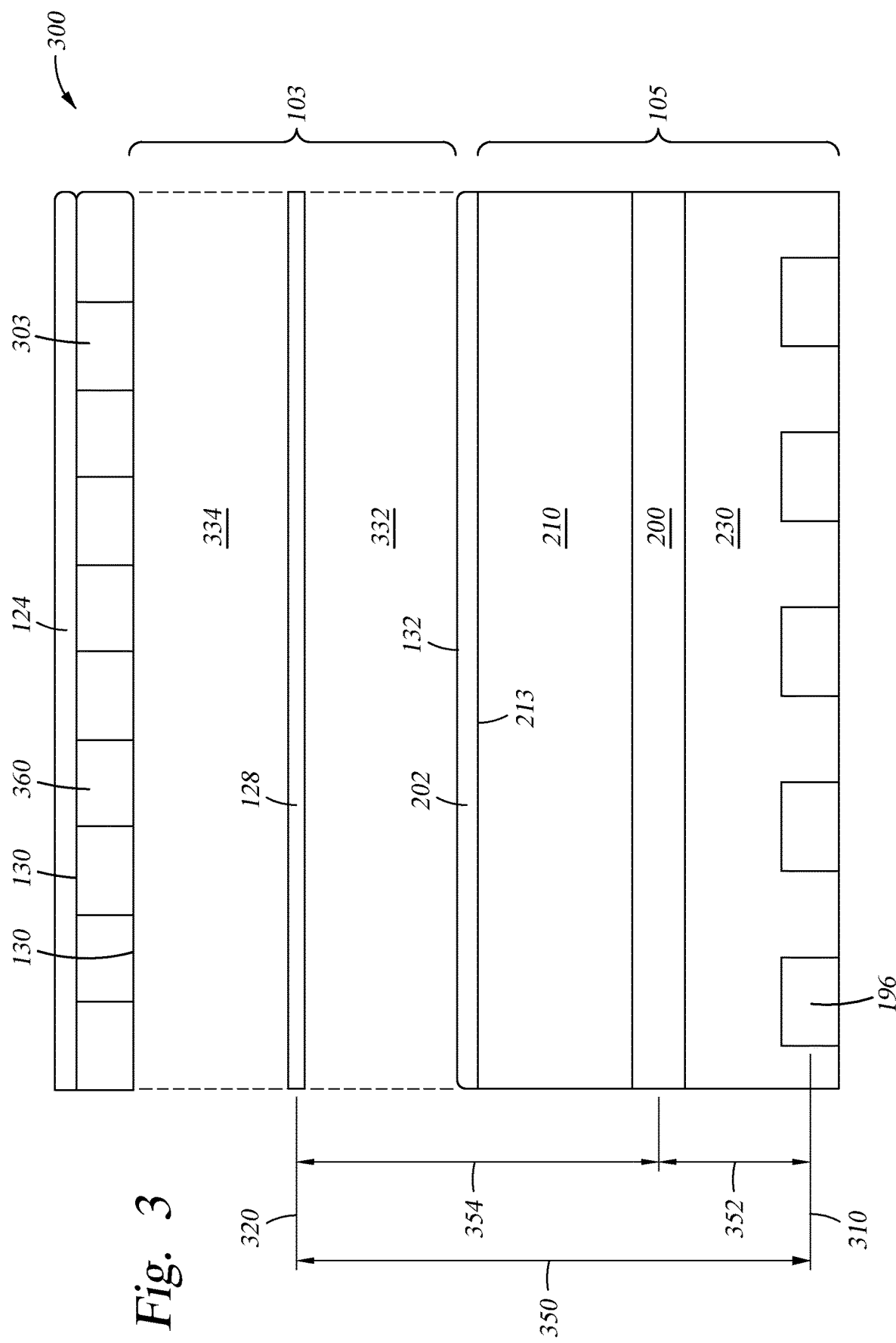
FIG. 3 is a layer stack of the exemplary substrate support assembly according to an embodiment.

FIG. 3 is a layer stack 300 of the substrate support assembly 101 according to an embodiment. The layer stack 300 illustrates a plurality of layers of the substrate support assembly 101 which form the cooling base assembly 105 and the ESC 103. The layer stack 300 illustrates a first ceramic layer 332 and a second ceramic layer 334 separated by the heaters 128 in the ESC 103. The layer stack 300 illustrates the cooling base 230 and the metal base 210 separated by the adjustable thermal break 200 in the cooling base assembly 105. The bonding layer 202 separating the ESC 103 from the cooling base assembly 105. However, it should be appreciated that other layers may be incorporated into the ESC 103, the cooling base assembly 105 or the substrate support assembly 101 as a whole.

The cooling base 230 may be formed of aluminum, molybdenum, or other suitable material The coolant channels 196 in the cooling base assembly 105 are utilized to regulate the temperature of the support surface 130 and the substrate 124 disposed on the substrate support assembly 101. The coolant channels 196 provide a heat sink 310 for the layer stack 300 when cooling fluid is flowing therethrough.

The adjustable thermal break 200 is configured to be filled, pressurized and emptied of a fluid, such as a gas, for adjusting the thermal conductivity across the adjustable thermal break 200. For example, the thermal conductivity across the adjustable thermal break 200 may be increased by introducing a gas into the adjustable thermal break 200 or increasing the density of a gas already disposed within the adjustable thermal break 200. Conversely, the thermal conductivity across the adjustable thermal break 200 may be decreased by removing a gas from the adjustable thermal break 200 or decreasing the density of a gas already disposed within the adjustable thermal break 200. Thus, the adjustable thermal break 200 has variable thermal conductivity which can be adjusted to increase or decreasing the heat removal from the ESC 103 by the cooling base assembly 105.

The metal base 210 may be formed of a metal. The metal in the metal base 210 provides and mass of material which helps regulate the temperature of the surrounding materials providing "inertia" against temperature fluctuations. The metal base 210 has a thermal conductivity between about 120 W/(m·K) and about 250 W/(m·K). However, it should be appreciated that the metal base 210 may have a thermal conductivity and thermal expansion suited to the operating temperature range for the substrate support assembly 101.

The bonding layer 202 is disposed on the metal base 210. The bonding layer 202 may be formed from perfluoro compound such as perfluoropolymer, polyimide, silicone, porous graphite or an acrylic compound or other suitable material. The bonding layer 202 is extremely stable conferring high thermal and chemical stability adheres well to ceramics, are not rigid, have minimal compression, and have the ability to withstand considerable strain. The bonding layer 202 may have a thickness minimized to enhance thermal conductivity. The bonding layer 202 is configured to couple the metal base 210 to the first ceramic layer 332.

The first ceramic layer 332 may be fabricated from a ceramic material, such as alumina ($Al_2O_3$), aluminum nitride (AlN) or other suitable material. Alternately, the first ceramic layer 332 may be fabricated from a material other than ceramic such as a polymer, such as polyimide, polyetheretherketone, polyaryletherketone and the like.

The heaters 128 are disposed between the first ceramic layer 332 and the second ceramic layer 334. The heaters 128 provide a heat source 320 for the layer stack 300. Alternately or additionally, the plasma formed during processing the substrate 124 may provide the heat source 320 for the layer stack 300. Thus the heat source 320 may be above the support surface 130 of the layer stack 300 when the heaters are off or not present and the temperature of the processing chamber is elevated above the cooling base assembly 105.

The second ceramic layer 334 may be formed from substantially the same material as the first ceramic layer 332. For example, the second ceramic layer may be fabricated from a ceramic material, such as alumina ($Al_2O_3$), aluminum nitride (AlN) or other suitable material. Alternately, the second ceramic layer 334 may be fabricated from a polymer, such as polyimide, polyetheretherketone, polyaryletherketone and the like.

Additionally, the layer stack 300 may include a plurality of mesas 303. During operation, the substrate 124 is supported on the mesas 303 while a cooling or backside gas is flowed in a space 360 defined between the mesas 303 for promoting heat transfer between the ESC 103 and the substrate 124. The backside gas, such as helium (He), is utilized to maintain the uniformity of the temperature of the substrate 124 when the substrate 124 is undergoing processing on the layer stack 300.

The adjustable thermal break 200 controls the heat flowing therethrough by conduction and convection. The rate of heat transfer conducted to an object is equal to the thermal conductivity of the material the object is made from, multiplied by the surface area in contact, multiplied by the difference in temperature between the two objects, divided by the thickness of the material. The rate of heat transfer convection from one place to another by the movement of fluids is the area of the object multiplied by the heat transfer coefficient and the difference between the fluid temperature and the objects surface temperature. By adjusting the flow and pressure of the fluid flowing through the adjustable thermal break 200, the transfer of heat across the adjustable thermal break 200 can be modified from a thermal insulator to a thermally conductor. Thus, the adjustable thermal break 200, disposed between the heat source 320 and heat sink 310, can be used to select the thermal conductivity between the heat source 320 and heat sink 310 by controlling properties, such as type, density, pressure, temperature, etc., of the fluid provided to the adjustable thermal break 200.

The heat source 320 and heat sink 310 are spaced apart by a distance 350. In the example of FIG. 3, the heat source 320 is shown disposed between first ceramic layer 332 and second ceramic layer 334. The thickness of the first ceramic layer 332 in the second ceramic layer 334 may be selected to move the heat source 320 closer to or further away from the support surface 130 of the ESC 103. It should additionally be appreciated that the heat source 320 may be above the support surface 130 for example in the case where the heat source 320 is a result of the plasma in the processing chamber 100. The adjustable thermal break 200 may additionally, or alternately, be positioned closed to the heat source 320. The adjustable thermal break 200 may be positioned a first distance 352 away from the heat sink 310 and a second distance 354 away from the heat source 320. It should be appreciated that the adjustable thermal break 200 may be positioned anywhere between the heat sink 310 and the heat source 320. As the adjustable thermal break 200 is moved closer to the heat source 320, i.e., the second distance 354 is made smaller. Where the adjustable thermal break 200 is disposed in the cooling base assembly 105, the second distance 354 may correspond to the thickness of the metal base 210. A smaller metal base 210 results in a smaller mass of material having residual thermal energy being disposed above the adjustable thermal break 200 and proximate, or affecting, the heat source 320. Thus, making the second distance 354 smaller has the effect of making the ESC 103 more responsive to changes of thermal conductivity of the adjustable thermal break 200 for controlling the heat on the support surface 130 of the ESC 103.

Introducing a fluid or increasing the density of the fluid, such as helium gas, into the adjustable thermal break 200 allows heat from the heat source 320 to be more quickly removed by the heat sink 310. Conversely, removing a fluid or decreasing density of the fluid in the adjustable thermal break 200 increases the insulative properties of the adjustable thermal break 200 and reduces the amount of heat from the heat source being removed by the heat sink 310.

Figure 4:
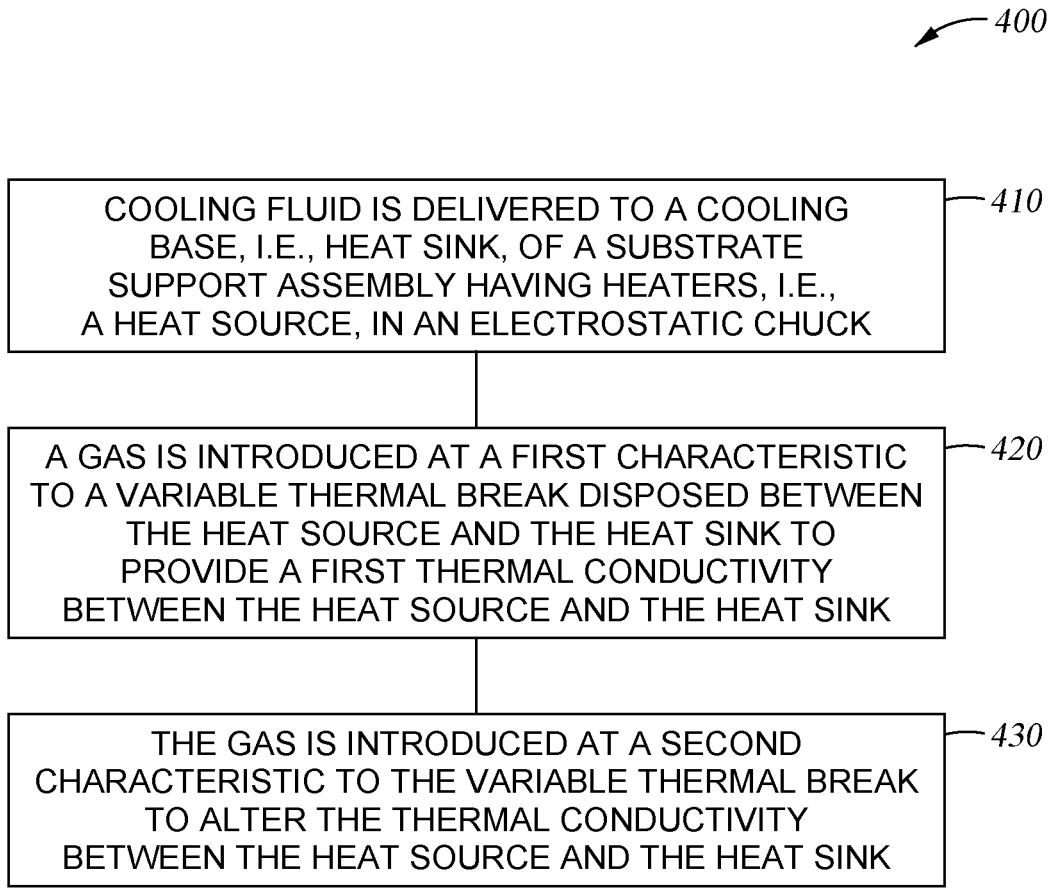
FIG. 4 is a method of controlling the temperature of a substrate support assembly according to an embodiment.

FIG. 4 is a method 400 of controlling the temperature of the exemplary substrate support assembly according to an embodiment. The method 400 begins at block 410 where cooling fluid is delivered to a cooling base, i.e., heat sink, of a substrate support assembly having heaters, i.e., a heat source, in an electrostatic chuck.

At block 420, a gas is introduced at a first characteristic to an adjustable thermal break disposed between the heat source and the heat sink. The first characteristic of the gas may be one of density, pressure, type of gas or fluid, temperature or even the absence of any gas such as in a vacuum. The gas in the adjustable thermal break provides a first thermal conductivity between the heat source and the heat sink.

A first substrate may be processed on the substrate support assembly at a first temperature. The temperature of the substrate may be regulated by the substrate support assembly to maintain the temperature within process parameters for processing the substrate on the substrate support. As the substrate is finished processing, the plasma is turned off and the thermal load from the plasma no longer affects the substrate support.

At block 430, the gas is introduced at a second pressure to the adjustable thermal break to alter the thermal conductivity between the heat source and the heat sink. In one embodiment, for example, immediately after processing a substrate and the plasma is off, the pressure is reduced for the gas in the adjustable thermal break to lower the thermal conductivity between the heat source and heat sink for to prevent loss of heat from the heater to the cooling channels. In another embodiment, for example, while processing a substrate and the plasma is on, the pressure is increased for the gas in the adjustable thermal break to raise the thermal conductivity between the heat source and heat sink to allow the heat from the heater to dissipate to the cooling channels and prevent thermal runaway of the process. Thus, the gas in the adjustable thermal break provides a first thermal conductivity between the heat source and the heat sink. The firth thermal conductivity may be adjusted by changing a property of the gas in the adjustable thermal break to provide a second thermal conductivity.

A second substrate may be processed on the substrate support assembly at the first temperature. Alternately, the second substrate may be processed at a second temperature different than the first temperature.

Advantageously, the adjustable thermal break provides a quick response to thermal conditions to provide better thermal control and reduced operational costs. For example, the resistive heaters in the substrate support assembly may be designed for lower power due to the reduced effects of the cooling base as a heat sink, allowing smaller circuit breakers and cables sizes to be scaled down. The lower power additionally eliminates/reduce destructive arcs when shorts occur.

While the foregoing is directed to examples of the present disclosure, other and further examples of the disclosure may be devised without departing from the basic scope thereof, and the scope thereof is determined by the claims that follow.

What is claimed is:

1. A substrate support assembly comprising:
   an electrostatic chuck including at least one heater; and
   a cooling base assembly comprising:
      a metal base disposed adjacent the electrostatic chuck;
      a cooling base disposed under the metal base;
      a cooling channel disposed within the cooling base, wherein the electrostatic chuck is disposed on the cooling base assembly; and
      an adjustable thermal break disposed between the heater and the cooling channel, where the adjustable thermal break has one or more fluid conduits coupled thereto, the fluid conduits configured to flow a fluid into and out of the adjustable thermal break for varying thermal conductivity between the heater and the cooling channel.

2. The substrate support assembly of claim 1, wherein the adjustable thermal break is disposed between the metal base and the cooling base.

3. The substrate support assembly of claim 1, wherein the adjustable thermal break further comprises:
   a plurality of thermally insulating stand-offs.

4. The substrate support assembly of claim 3, wherein the thermally insulating stand-offs are formed from a material different than the cooling base assembly.

5. The substrate support assembly of claim 3, wherein the fluid conduits couple the adjustable thermal break to a backside gas source, wherein the backside gas source is configured to additionally provide a gas to a space formed by a plurality of mesas formed on a top surface of the substrate support assembly and a substrate disposed thereon the mesas.

6. A process chamber comprising:
   a chamber body having walls and a lid defining a processing region; and
   a substrate support assembly disposed in the processing region, the substrate support assembly comprises:
      an electrostatic chuck including at least one a heater;
      a cooling base assembly comprising:
         a metal base disposed adjacent the electrostatic chuck;
         a cooling base disposed under the metal base;
         a cooling channel disposed within the cooling base, wherein the electrostatic chuck is disposed on the cooling base assembly; and
         an adjustable thermal break disposed between the heater and the cooling channel, where the adjustable thermal break has one or more fluid conduits coupled thereto and configured to flow a fluid into and out of the adjustable thermal break for varying thermal conductivity between the heater and the cooling channel.

7. The process chamber of claim 6, wherein the adjustable thermal break is disposed between the metal base and the cooling base.

8. The process chamber of claim 6, wherein the adjustable thermal break further comprises:
   a plurality of thermally insulating stand-offs.

9. The process chamber of claim 8, wherein the thermally insulating stand-offs are formed from a material different than the cooling base assembly.

10. The process chamber of claim 8, wherein the fluid conduits couple the adjustable thermal break to a backside gas source, wherein the backside gas source is configured to additionally provide a gas to a space formed by a plurality of mesas formed on a top surface of the substrate support assembly and a substrate disposed thereon the mesas.

11. The process chamber of claim 6, further comprising:
    a vacuum source coupled to the adjustable thermal break.

12. A method for adjusting thermal conductivity between a substrate support and a cooling base in a substrate support assembly, the method comprising:
    delivering cooling fluid to a cooling base of a substrate support assembly, the substrate support assembly having a substrate support with heaters disposed therein above the cooling base, wherein the cooling base assembly comprises:
       a metal base disposed adjacent to the substrate support;
       a cooling base disposed under the metal base, wherein the heaters are disposed therein above the cooling base; and
       a cooling channel disposed within the cooling base; and
    providing a gas or a vacuum to an adjustable thermal break disposed outside and in between the substrate support and the cooling base to modify the thermal conductivity between the substrate support and the cooling base.

13. The method of claim 12, further comprising:
    providing the gas at a first pressure;
    providing the gas at a second pressure different than the first pressure, wherein introducing the gas at the second pressure comprises:
       reducing the first pressure of the gas in the adjustable thermal break to the second pressure to reduce the thermal conductivity between the substrate support and the cooling base.

14. The method of claim 13 wherein introducing the gas at the second pressure comprises:
    increasing the first pressure of the gas in the adjustable thermal break to the second pressure to increase the thermal conductivity between the substrate support and the cooling base.

15. The method of claim 14 further comprising:
processing a substrate disposed on the substrate support assembly with the gas in the adjustable thermal break at the second pressure.

16. The method of claim 12 wherein the gas is supplied from a backside gas source.

17. The method of claim 12 wherein the gas is supplied from a source different than a backside gas source.

18. The method of claim 12, further comprising:
drawing from a vacuum source a vacuum in the adjustable thermal break.

* * * * *